United States Patent
Misra et al.

(10) Patent No.: US 10,725,519 B1
(45) Date of Patent: Jul. 28, 2020

(54) POWER CONTROL BASED ON POWER CONTROLLER CONFIGURATION RECORDS

(71) Applicant: Amazon Technologies, Inc., Seattle, WA (US)

(72) Inventors: Anand Misra, Fremont, CA (US); Vijay Patel, Olympia, WA (US); Prashant Singh, Sammamish, WA (US); Roey Rivnay, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 202 days.

(21) Appl. No.: 15/905,037

(22) Filed: Feb. 26, 2018

(51) Int. Cl.
*G06F 1/26* (2006.01)
*G06F 1/30* (2006.01)
*G06F 1/28* (2006.01)
*H05K 7/14* (2006.01)

(52) U.S. Cl.
CPC .............. *G06F 1/305* (2013.01); *G06F 1/263* (2013.01); *G06F 1/28* (2013.01); *H05K 7/1492* (2013.01)

(58) Field of Classification Search
None
See application file for complete search history.

(56) References Cited

U.S. PATENT DOCUMENTS

| | | | |
|---|---|---|---|
| 10,348,124 B1* | 7/2019 | MacGregor | G06F 1/30 |
| 2010/0017630 A1* | 1/2010 | Chen | G06F 1/189 |
| | | | 713/300 |
| 2010/0042852 A1* | 2/2010 | Yin | G06F 1/26 |
| | | | 713/300 |
| 2015/0177808 A1* | 6/2015 | Sarti | G06F 1/30 |
| | | | 713/300 |
| 2017/0010652 A1* | 1/2017 | Huang | G06F 1/3234 |
| 2017/0265325 A1* | 9/2017 | Klikic | H05K 7/1492 |
| 2017/0293341 A1* | 10/2017 | Jenne | G06F 1/263 |
| 2019/0094936 A1* | 3/2019 | Cook | G06F 1/28 |
| 2019/0207397 A1* | 7/2019 | Lai | B60L 53/68 |

* cited by examiner

*Primary Examiner* — Danny Chan
(74) *Attorney, Agent, or Firm* — Kilpatrick Townsend & Stockton LLP

(57) ABSTRACT

Power systems and methods for supplying direct current power to a server rack via a power shelf assembly that includes multiple power supply units (PSUs) and a power shelf controller (PSC) that ensures a correct configuration of PSUs, backup battery units (BBUs), and connection components using a power shelf configuration record. Upon a boot cycle of the PSC, the configuration identified in the power shelf controller is compared to an actual configuration of the components being connected between a server rack and the power shelf assembly to avoid providing power too soon and causing an overload of components for the server rack.

19 Claims, 9 Drawing Sheets

| | 902 Field | 904 Length | 906 Value | 908 Remark | |
|---|---|---|---|---|---|
| 1 | Record Type 910 | 0x01 | 0xC0 | Power Shelf Configuration Record | |
| 2 | Record Checksum 912 | 0x01 | | | |
| 3 | Header Checksum 914 | 0x01 | | | |
| 4 | Data Center Type 916 | 0x01 | 918 | Data Center Type | Description |
| | | | | 0 | Reserved |
| | | | | 1 | Type A Data Center |
| | | | | 2 | Type B Data Center |
| | | | | 3 | Type C Data Center (with single phase whips only) |
| | | | | 7..4 | Reserved |
| 5 | Number of Whips 920 | 0x01 | 922 | Bit Position | Whip # |
| | | | | 0 | Reserved |
| | | | | 1 | 1 |
| | | | | 2 | 2 |
| | | | | 3 | 3 |
| | | | | 4 | 4 |
| | | | | 5 | 5 |
| | | | | 7..6 | Reserved |
| 6 | Number of PSUs 924 | 0x02 | 926 | Bit Position | PSU # |
| | | | | 0 | 0 |
| | | | | 1 | 1 |
| | | | | 2 | 2 |
| | | | | 3 | 3 |
| | | | | 4 | 4 |
| | | | | 5 | 5 |
| | | | | 6 | 6 |
| | | | | 7 | 7 |
| | | | | 8 | 8 |
| | | | | 15..9 | Reserved |

FIG. 9

POWER CONTROL BASED ON POWER CONTROLLER CONFIGURATION RECORDS

BACKGROUND

A datacenter typically contains a collection of computer servers and components for the management, operation, and connectivity of those servers, including power management systems that provide continued power for operation of datacenter components in the event of interruption of power provided by a primary power source. Existing power management systems for datacenters, however, typically employ secondary power sources that are relatively large and expensive.

BRIEF DESCRIPTION OF THE DRAWINGS

Various embodiments in accordance with the present disclosure will be described with reference to the drawings, in which:

FIG. 9 is an example power shelf configuration record, in accordance with at least one embodiment.

DETAILED DESCRIPTION

Figure 1:
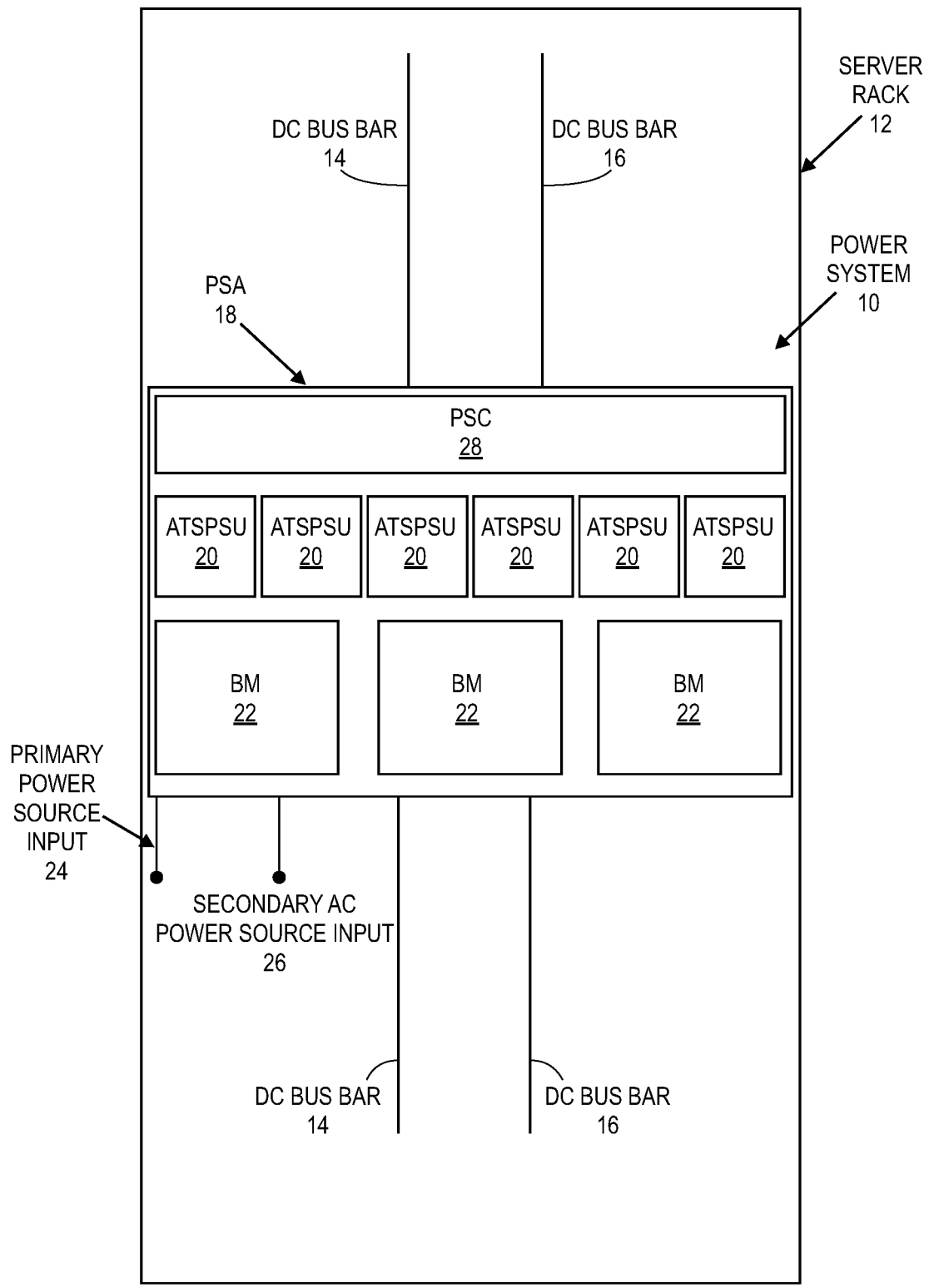
FIG. 1 is a front view of a redundant uninterruptable power shelf system mounted in a server rack for supplying direct current (DC) power to server rack components via DC bus bars of the server rack, in accordance with at least one embodiment.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments herein are directed to providing a power system for supplying direct current (DC) to a server rack that includes a power shelf assembly (PSA), a power shelf controller (PSC), one or more detachably mountable automatic transfer switch and power supply units (ATSPSUs), one or more detachably mountable battery modules (BMs), and/or one or more backup battery units (BBUs). Each of the one or more ATSPSUs is configured to generate DC power from alternating current (AC) input power and output the DC power to the DC bus bars of the server rack. Each of the one or more BMs and/or BBUs is configured to provide backup DC power to the DC bus bars in the event of discontinuity in the supply of the DC power to the DC bus bars by the ATSPSUs.

Each of the one or more ATSPSUs and each of the one or more BMs/BBUs can employ an autonomous control process that can be used in the absence of communication with other elements of the power system. For example, each of the ATSPSUs can be configured to monitor voltage of a primary AC power source and react to significant discontinuities in the voltage of the primary AC power source by discontinuing output of DC power to the DC bus bars. The one or more BMs/BBUs can monitor the voltage between the DC bus bars and, in response to a drop in the voltage between the DC bus bars indicative of insufficient supply of DC power to the DC bus bars by the one or more ATSPSUs, supply DC power to the DC bus bars for a period of time. Any suitable number of the one or more ATSPSUs can be configured to switch over to generating DC power from AC power supplied by a secondary AC power source to supply DC power to the DC bus bars, for example, either in response to a drop in voltage between the DC bus bars indicative of insufficient supply of DC power to the DC bus bars by the one or more BMs/BBUs, or after a suitable time delay following failure of the primary AC power source. The one or more BMs/BBUs can be configured to, in response to detecting a sufficient voltage level between the DC bus bars, charge at a conservative rate, which can be set (e.g., via firmware/software) so that upstream circuit breakers are not tripped under maximum loads.

Control of the power system can be augmented via communication between the one or more ATSPSUs and the one or more BMs/BBUs. For example, a state of charge of the one or more BMs/BBUs can be communicated to the one or more ATSPSUs and, in response to the state of charge being sufficient to power the server rack components for a suitable time period, the one or more ATSPSUs can allow the BMs/BBUs to discharge without transferring to generating DC power via power supplied by the secondary AC power source. The BMs/BBUs can communicate each of their states of charge with the other of the BMs/BBUs and decide to charge or discharge separately or in unison. The one or more ATSPSUs can communicate the current power usage of the server rack components to the BMs/BBUs, which can use the current power usage to control recharging to maximize the recharging of the BMs/BBUs without exceeding total maximum allowable power usage.

In accordance with at least one embodiment, control of the power system can be augmented via communication between the power shelf controller (PSC) of the PSA, the one or more ATSPSUs, and the one or more BMs/BBUs, or between a central management module and one or more PSAs of a datacenter power management system via an associated communication network. In various embodiments, the PSA may include non-volatile memory for storing and updating a power shelf configuration record that includes one or more parameters for an expected configuration of PSUs, BBUs, and whips (connection components) between a given PSA and a given server rack. In an embodiment, the power shelf configuration record may identify an expected configuration that includes a number of PSUs, a number of BBUs, a number of connection components, and/or a data center type. The power shelf configuration record may be updated when the PSC is installed into a PSA, as part of a new shelf integration, or during a replacement operation in a fleet of server racks/data centers.

In accordance with at least one embodiment, the PSC firmware accesses the power shelf configuration record during a bootloader execution and pushes/transmits the parameters included in the power shelf configuration record to the complex programmable logic devices (CPLDs) associated with the ATSPSUs, BMs/BBUs, and/or associated CPLD registers of the PSA. A programmable component may be, for example a CPLD or other integrated circuit. By pushing or transmitting the parameters included in the power shelf configuration record to the CPLD registers, the CPLD registers are able to prevent executing a CPLD PS_ON Signal or command used to turn on the PSUs and thereby prevent an Over Current Protection (OCP) shutdown fault while an operator connects the PSUs and connection components between the PSA and the server rack. In an embodiment, the parameters are utilized by the CPLD to compare the expected number of PSUs and connection components to the actual configuration of PSUs and connection components (e.g., those PSUs and connection components actually connected by the operator between the server rack and PSA). In response to the comparison, the CPLD can set a flag register to indicate the detection of a correct or incorrect configuration. The PSC firmware may generate a system event log (SEL) when it detects an incorrect configuration or an error condition. The SEL can be used by operators to update the configuration to the correct configuration given the type of server rack and the capabilities of the PSA.

FIG. 1 is a front view of a redundant uninterruptable power shelf system mounted in a server rack for supplying direct current (DC) power to server rack components via DC bus bars of the server rack, in accordance with at least one embodiment. FIG. 1 includes a power system 10 mounted in a sever rack 12, in accordance with embodiments. The power system 10 is configured to redundantly supply DC power to components mounted in server rack 12 via DC bus bars 14, 16 of the server rack 12. The power system 10 includes a power shelf assembly (PSA) 18, automatic transfer switch and power supply units (ATSPSUs) 20, and battery modules (BMs) 22. In some embodiments, the BMs may also be referred to as backup battery units (BBUs). In the illustrated embodiment, each of the ATSPSUs 20 and each of the BMs 22 is detachably mountable to the PSA 18 via insertion through a front face of the server rack 12. A primary AC power source input 24 and a secondary AC power source input 26 are operatively coupled with the PSA 18, which operatively couples each of the primary AC power source input 24 and the secondary AC power source input 26 with each of the ATSPSUs 20 when mounted to the PSA 18. In accordance with at least one embodiment, the PSA 18 may be pre-configured to pre-assembled with a set number of connected PSUs and BMs. In such configurations, the PSC 28 may access the associated power shelf configuration record to ensure a proper connection configuration is followed by an operator using connection components (whips) to connect the PSUs of the ATSPSUs 20 to the server rack 12.

The ATSPSUs 20 and the BMs 22 are configured to redundantly supply power to the DC bus bars 14, 16 for consumption by components mounted in the server rack 12. Each of the ATSPSUs 20 are configured to generate DC power from AC power received from either the primary AC power source input 24 or the secondary AC power source input 26 via the PSA 18, and output the generated DC power to the DC bus bars 14, 16. Each of the BMs 22 provides a backup source of DC power that is supplied to the DC bus bars 14, 16 in the event of insufficient DC power being supplied to the DC bus bars 14, 16 by the ATSPSUSs 20. In accordance with at least one embodiment, the PSA 18 may include a PSC 28 that is configured to access a power shelf configuration record that identifies one or more parameters for ensuring a correct configuration of ATSPSUs and BMs are connected between the PSA 18 and the server rack 12. In an embodiment, the PSC 28 may be removed upon a boot sequence of the PSA 18 and the ATSPSUSs 20 and BMs 22 can continue to generate DC power from AC power received from either the primary AC power source input 24 or the secondary AC power source input 26. The boot sequence of the PSC 28, using the power shelf configuration record, is configured such that upon a correct configuration of ATSPSUs 20 and BMs 22 being connected to the server rack 12, a CPLD of the PSA 18 may set a flag for continuous power or power on signal (e.g., indicating that the PSU may be powered on) so that the ATSPSUs 20 and BMs 22 continue to provide power to the server rack 12. In various embodiments, the PSC 28 may communicate directly with components of the PSA 18, such as by communicating directly with the ATSPSU 20, associated PSUs, or BMs 22 to set flags or otherwise execute commands to provide power to the server rack 12. Although many embodiments described herein depict a power shelf as having a form factor that fits within a portion of a server rack, the power shelf can also have other form factors that do not necessarily fit within the server rack.

Figure 2:
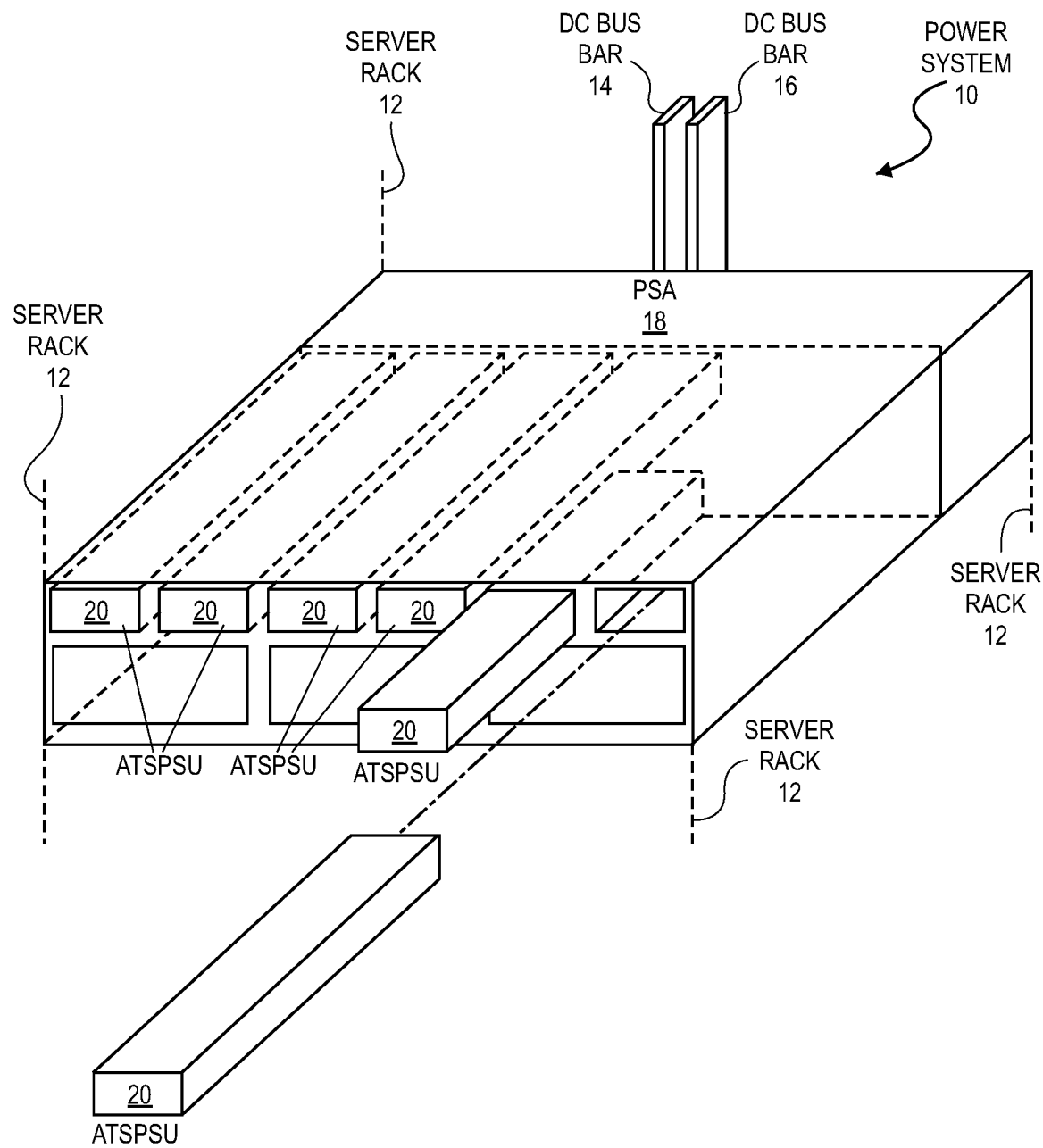
FIG. 2 is a three-dimensional view illustrating a detachably mountable automatic transfer switch and power supply unit (ATSPSU) and a power shelf assembly (PSA) of the power shelf system of FIG. 1, in accordance with at least one embodiment.
Figure 3:
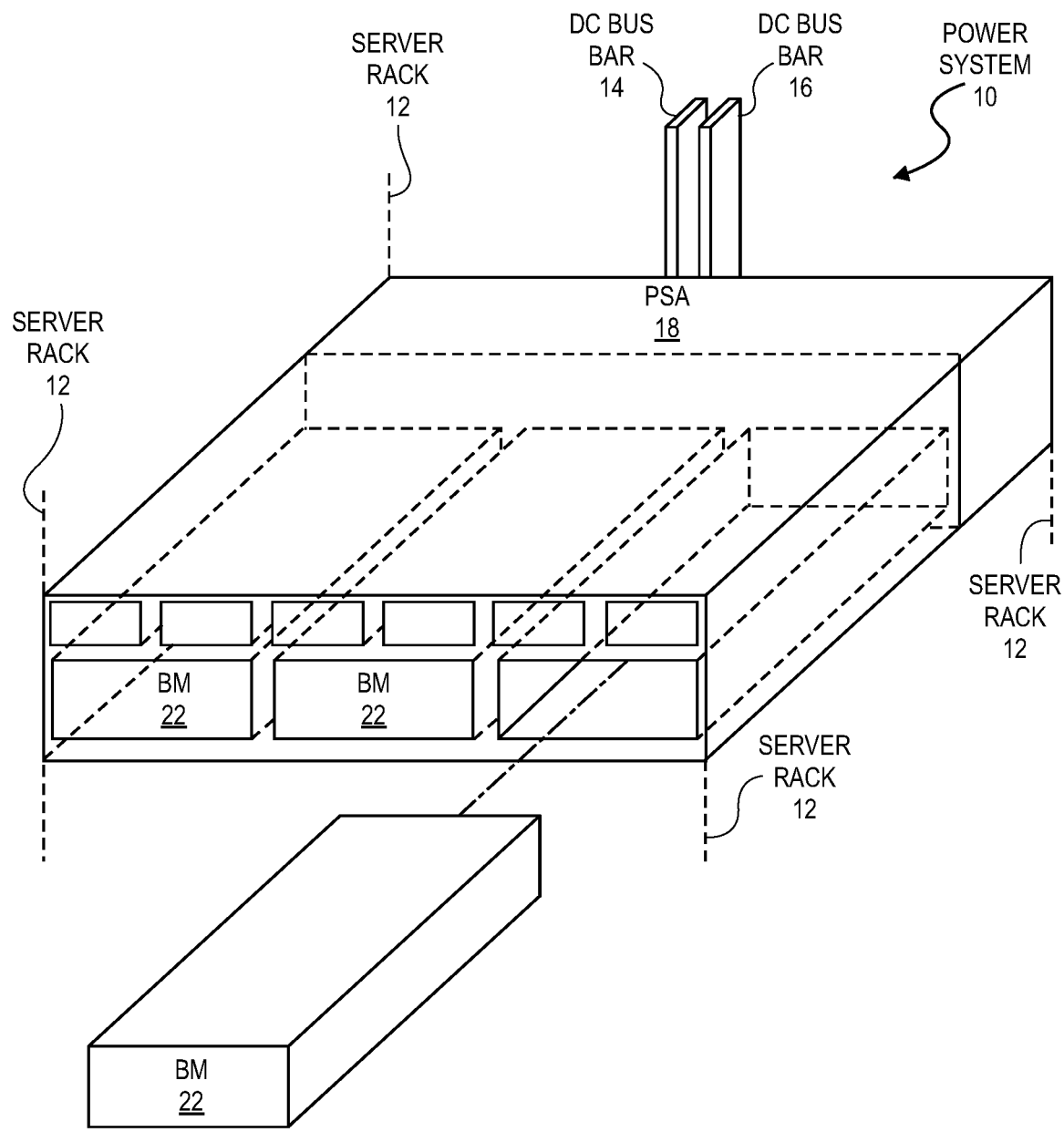
FIG. 3 is a three-dimensional view illustrating a detachably mountable battery module (BM) and a power shelf assembly (PSA) of the power shelf system of FIG. 1, in accordance with at least one embodiment.

FIGS. 2 and 3 show a three-dimensional view further illustrating the power system 10. FIG. 2 shows a three-dimensional view illustrating ATSPSUs 20 mounted to the PSA 18 of the power system 10, which is mounted in the server rack 12. FIG. 3 shows a three-dimensional view illustrating BMs 22 mounted to the PSA 18 of the power system 10, which is mounted in the server rack 12. In the illustrated embodiment, six ATSPSUs 20 are arranged side-by-side in an upper row and three BMs 22 are arranged side-by-side in a lower row below the upper row. In some embodiments, each of the ATSPSUs 20 and each of the BMs 22 can be "hot" mounted to and demounted from the PSA 18 while power is supplied to DC bus bars 14, 16 via the other mounted ATSPSUs 20 and/or BMs 22. In the illustrated embodiment, having six ATSPSUs 20, at 3 KVA each, provide 18 KVA total, thereby exceeding a desired minimum of 15 KVA. Additionally, having six ATSPSUs 20 enable having two ATSPSUSs 20 on each of three phases of an AC power source. In accordance with at least one embodiment, the power shelf configuration record may identify an expected configuration of PSUs (e.g., a certain number of PSUs) that are to be utilized with a particular type of server rack and an expected number of connection components for connecting the PSUs to the server rack 12. The expected configuration of PSUs may be less than the actual amount of PSUs or ATSPSUs 20 that are associated with the PSA 18.

For example, the power shelf configuration may utilize an N+1 redundancy to ensure that at least one extra ATSPSU is available for use by the PSA 18 in response to a failed or malfunctioning ATSPSU of the ATSPSUs 20. The power shelf configuration record for a given PSA 18 may be updated or specified differently for each type and configuration of server rack to maintain the N+1 redundancy of associated ATSPSUs 20, BMs 22, and connection components.

Figure 4:
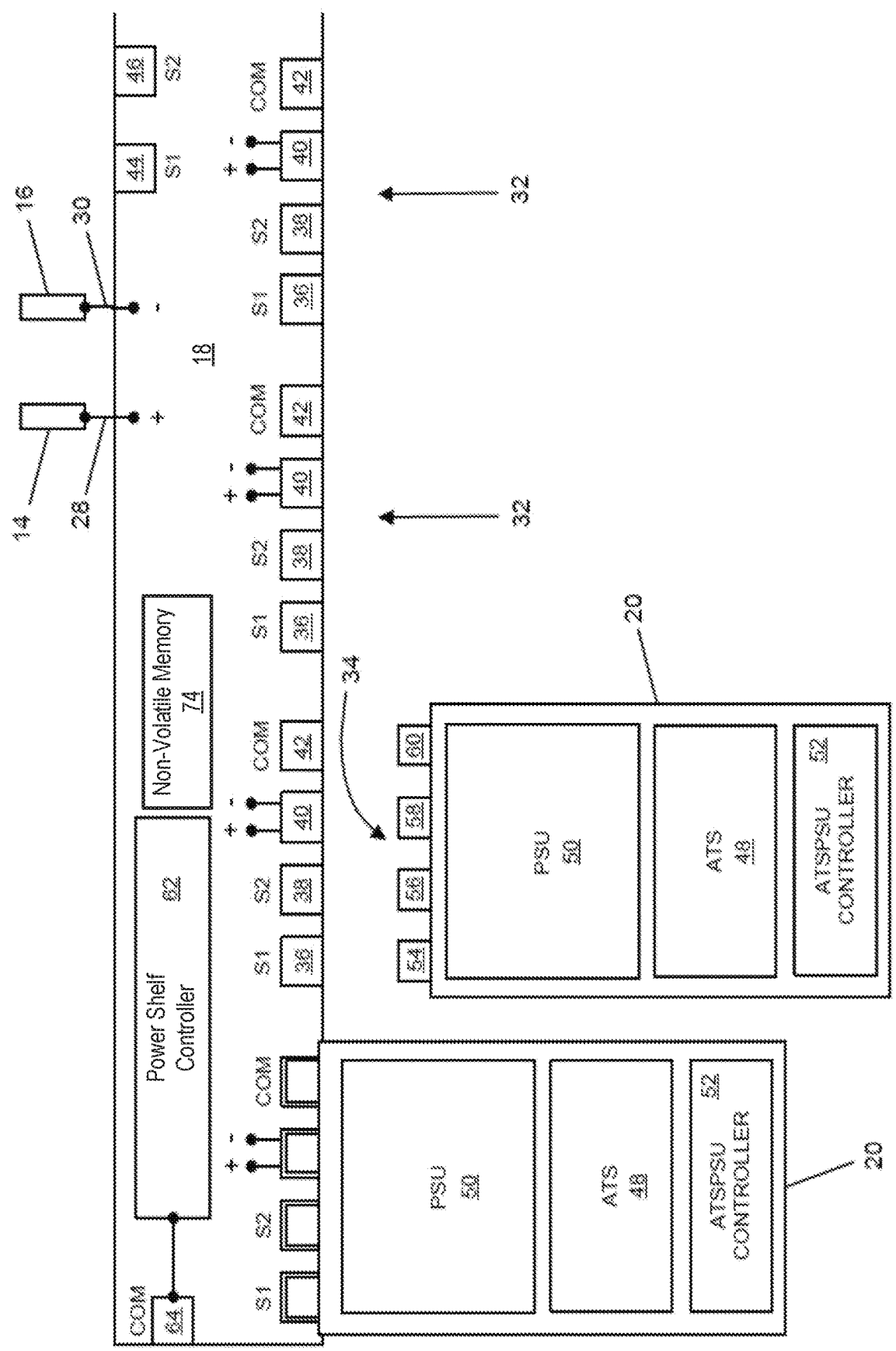
FIG. 4 is a simplified schematic diagram illustrating exemplary embodiments of the PSA of FIG. 1 using power supply units (PSUs), in accordance with at least one embodiment.

FIG. 4 is a simplified schematic diagram illustrating exemplary embodiments of the PSA of FIG. 1 using power supply units (PSUs), in accordance with at least one embodiment. The PSA 18 of FIG. 4 includes a PSA ATSPSU connector assembly 32 for each of the ATSPSUs 20. Each of the ATSPSUs 20 includes an ATSPSU connector assembly 34 configured to connect with a respective PSA ATSPSU connector 32.

The PSA 18 is configured to electrically connect each of the ATSPSUs 20 with a primary AC power source, a secondary power source, and the DC bus bars 14, 16. Each of the PSA ATSPSU connector assemblies 32 include a primary AC power source connector 36, a secondary AC power source connector 38, a DC power input connector 40, and a communication connector 42. The PSA 18 includes a primary AC power source input connector 44, which is electrically connected to each of the primary AC power source connectors 36 and configured to receive AC power from a primary AC power source. The PSA 18 includes a secondary AC power source input connector 46 which is electrically connected to each of the secondary AC power source connectors 38 and configured to receive AC power from a secondary AC power source. The PSA 18 electrically couples the DC bus bars 14, 16 with each of the DC power input connectors 40 via DC output leads 28, 30. The PSA 18 can have any suitable configuration, such as any suitable combination of conductors and connectors supported in any suitable manner.

The PSA 8 is configured to communicatively couple the ATSPSUs 20 and the BMs 22. The communication connectors 42 are communicatively coupled via a communication bus included in the PSA 18 to enable communication between each of the ATSPSUs 20 and each of the BMs 22, the power shelf controller 62, or one or more CPLDs implemented within the PSA 18 (not pictured). Any suitable communication connector can be used for the communication connector 42. For example, an RJ45 connector can be used as the communication connector and Ethernet networking used for communication between the ATSPSUs 20, the BMs 22, the power shelf controller 62, and the CPLDs. Although many of the disclosed embodiments describe using CPLDs for various functions, further embodiments use other integrated circuits (e.g., processors, field-programmable gate arrays (FPGAs), application-specific integrated circuits (ASICs)) along with or in place of the CPLDs. Additionally, the power shelf controller 62 comprises, for example, a microcontroller, a processor, a CPLD, FPGA, ASIC, or other integrated circuit.

Each of the ATSPSUs 20 includes an automatic transfer switch (ATS) 48, a power supply unit (PSU) 50, an ATSPSU controller 52, and the ATSPSU connector assembly 34. The ATSPSU connector assembly 34 includes a primary AC power source input connector 54, a secondary AC power source input connector 56, a DC power output connector 58, and a communication connector 60. Connector 54 is configured to connect with connector 36. Connector 56 is configured to connect with connector 38. Connector 58 is configured to connect with connector 40. Connector 60 is configured to connect with connector 42. The ATS 48 is electrically connected with each of connectors 54, 56 so as to be electrically connected with each of the primary and secondary AC power sources via the PSA 18. The ATS 48 is configured to selectively supply AC power to the PSU 50 from either the primary AC power source or the secondary AC power source as described herein. The PSU 50 generates DC power from the AC power received from the ATS 48 and outputs the generated power to the DC bus bars 14, 16 via the DC power output connector 58 and the PSA 18.

The ATSPSU controller 52 is operatively connected with the ATS 48 and the PSU 50 and controls operation of the ATS 48 and the PSU 50 as described herein. In many embodiments, the ATSPSU controller 52 is configured to (a) monitor a voltage of the primary AC power source (e.g., a line to neutral voltage of the primary AC power source); (b) monitor a voltage of the secondary AC power source (e.g., a line to neutral voltage of the secondary AC power source); (c) monitor voltage between the DC bus bars; (d) control the PSU 50 to terminate output of DC power from the PSU 50 to the DC power output connector 58 in response to detecting a qualifying voltage drop instance in the primary AC power source as described herein when the ATS 48 is supplying AC power to the PSU 50 from the primary AC power source or a qualifying voltage drop instance in the secondary AC power source as described herein when the ATS 48 is supplying AC power to the PSU 50 from the secondary AC power source; and (e) control the ATS 48 to switch between supplying AC power to the PSU 50 between the primary AC power source and the secondary AC power source in response to the monitored voltages of the primary and secondary AC power sources and the monitored voltage between the DC bus bars as described herein.

The PSA 18 can optionally include a power shelf controller 62 and/or an external communication port 64. The power shelf controller 62 can be configured to monitor total electrical power consumed by the components of the server rack 12 and coordinate operation of the ATSPSUs 20 and the BMs 22 in accordance with the total electrical power consumed and constraints on the amount of AC power that can be obtained from each of the primary and secondary AC power sources. The external communication port 64 can be used to network the ATSPSUs 20 and the BMs 22 and/or the power shelf controller 62 with an external power management module via a data center network so that the operation of the power system 10 can be controlled in conjunction with simultaneous control of one or more other power systems 10 supplying power to other server racks 12 powered by the primary and secondary AC power sources so as to better control total loads placed on one or both of the primary and secondary AC power sources. In some embodiments, the power shelf controller 62 may be configured to access a power shelf configuration record stored in non-volatile memory 74 of the PSA 18. As described herein, the power shelf configuration record may include one or more parameters that identify an expected configuration of ATSPSUs 20, BMs 22, and connection components (e.g., whips) between the PSA 18 and a given server rack 12.

The power shelf controller 62 may be configured to transmit the parameters of the power shelf configuration record stored in the non-volatile memory 74 to the ATSPSU controller 52 or other CPLDs associated with the ATSPSUs 20 and BMs 22. The CPLDs can compare the received parameters of the expected configuration of PSUs 50, ATSPSUs 20, BMs 22 and an actual configuration of the PSUs 50, ATSPSUs 20, BMs 22 being connected by an operator between the PSA 18 and server rack as indicated by PSA ATSPSU connector assemblies 32 and ATSPSU connector assembly 34. In accordance with at least one embodiment, the power shelf controller 62 may be configured to prevent energization of the components of the server rack 12 until a correct configuration of ATSPSUs 20, BMs 22, and connection components has been established according to the parameters included in the power shelf configuration record. Once a correct configuration of components between the PSA 18 and server rack 12 has been identified then the power shelf controller 62 may provide instructions or otherwise communicate with the associated CPLDs of the ATSPSUs 20 and BMs 22 to begin providing power to the server rack 12. In various embodiments, the power shelf controller 62 may be removed once the power on signals or instructions have been provided to the ATSPSUs 20 and BMs 22 for further updating or modifying. Further, the ATSPSUs 20 and/or BMs 22 may be swapped out without interrupting the power provided to the server rack 12. Swapping out components (a swap out operation) of a server rack 12, such as the ATSPSUs 20 and/or BMs 22 may include replacing one or more ATSPSUs 20 and/or BMs 22 in the server rack for another ATSPSU 20 or BM 22. A swap out operation may include receiving a SEL, a notification, or other information that indicates that a component of the server rack 12 and/or PSA 18 should be replaced (e.g., swapping out a given ATSPSU 20 or BM 22 for another ATSPSU 20 or BM 22 such as in the case of a component malfunction). The power shelf controller 62 and/or the CPLDs associated with the ATSPSUs 20 and BMs 22 may be configured to periodically poll or communicate that the correct configuration of components are connected and being utilized between the server rack 12 and PSA 18 (e.g., correct number of ATSPSUs 20, BMs 22, and connection components). As such, as long as the correct number of ATSPSUs 20, BMs 22, and connection components are being utilized after a swap or switch out of other components of the PSA 18, server may be uninterrupted for customers utilizing the data center and server rack 12.

Figure 5:
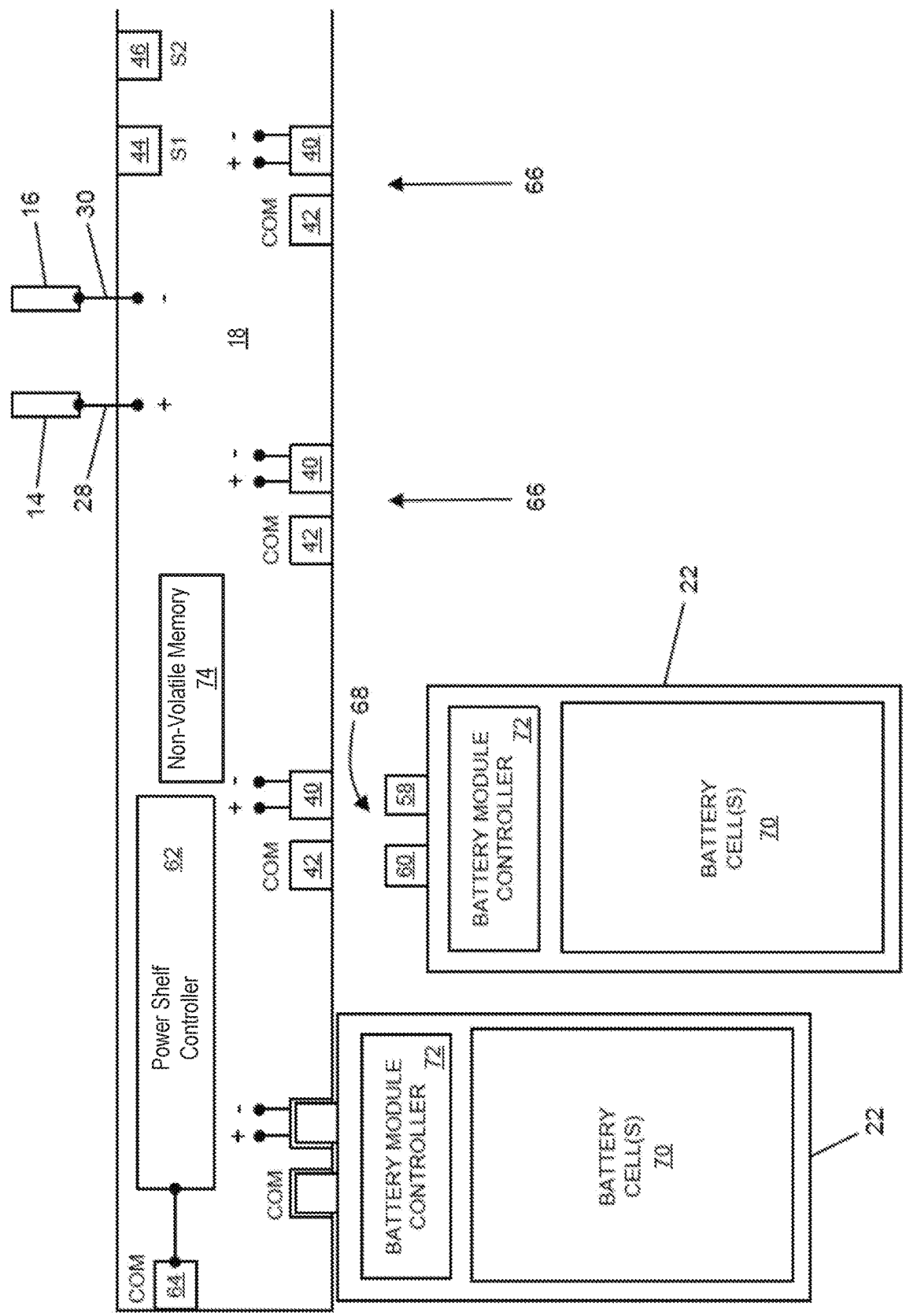
FIG. 5 is a simplified schematic diagram illustrating exemplary embodiments of the PSA of FIG. 1 using battery modules (BMs), in accordance with at least one embodiment.

FIG. 5 is a simplified schematic diagram illustrating an embodiment of the PSA 18 and BMs 22 of the power system 10. The PSA 18 includes a PSA BM connector assembly 66 for each of the BMs 22. Each of the BMs 22 includes a BM connector assembly 68 configured to connect with a respective PSA BM connector assembly 66.

The PSA 18 is configured to electrically connect each of the BMs 22 with the DC bus bars 14, 16. Each of the PSA BM connector assemblies 66 includes a DC power connector 40, and a communication connector 42. The PSA 18 electrically couples the DC bus bars 14, 16 with each of the DC power connectors 40 via DC output leads 28, 30.

Each of the BMs 22 includes one or more battery cells 70 and a BM controller 72, and the BM connector assembly 68. The BM connector assembly 68 includes a DC power connector 58 and a communication connector 60. Connector 58 is configured to connect with connector 40. Connector 60 is configured to connect with connector 42.

The BM controller 72 controls operation of the BM 22. In many embodiments, the BM controller 72 is configured to (a) monitor voltage between the DC bus bars; and (b) control discharging and charging of the one or more battery cells 70 as described herein. The PSA 18 of FIG. 5 includes a power shelf controller 62 and non-volatile memory 74 which is configured to perform the same capabilities as those described above with reference to FIG. 4 including storing and accessing a power shelf configuration record that can be utilized to ensure a correct configuration of BMs 22 and connection components have been utilized when attaching the PSA 18 to server rack 12 prior to providing a power on signal to the BMs 22.

Figure 6:
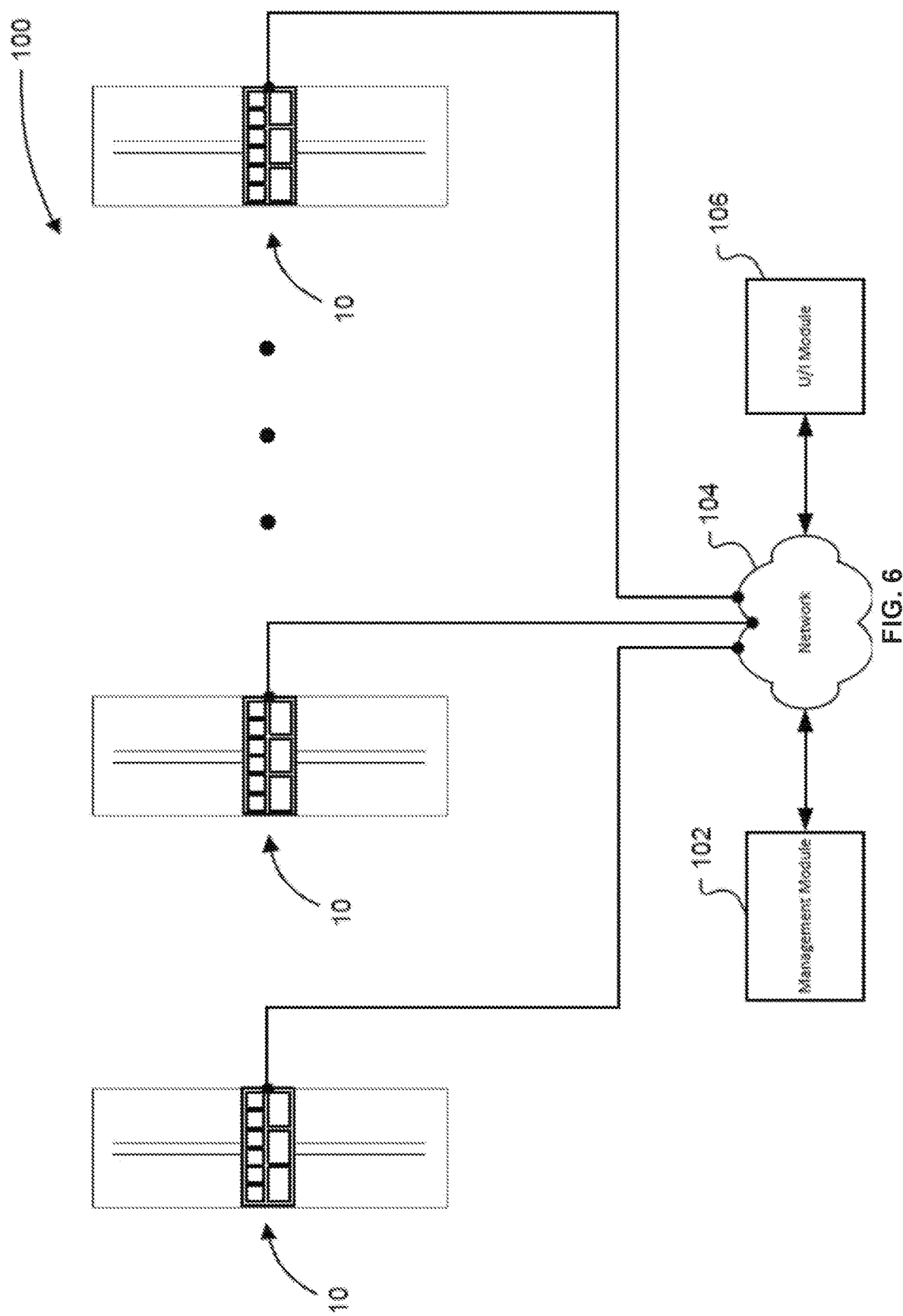
FIG. 6 is a simplified schematic diagram illustrating a datacenter power management system that includes multiple instances of the PSA of FIG. 1, a management module, and a communication network, in accordance with at least one embodiment.

FIG. 6 is a simplified schematic diagram illustrating a datacenter power management system 100 that includes multiple instances of the power system 10, a management module 102, a communication network 104, and a user interface module 106 in accordance with some embodiments. In the power management system 100, the management module 102 is configured to control operation of the individual power systems 10 so as to avoid overloading the secondary AC power source in the event of a failure of the primary AC power source. For example, the management module 102 can control which of the ATSPSUs 20 in each of the power systems 10 switch to generating DC power via AC power supplied by the secondary AC power source, thereby controlling the total load placed on the secondary AC power source to avoid overloading the secondary AC power source. The management module 102 can also monitor total data center power consumption level and limit charging of the BMs in each of the power systems 10 to a suitable rate in view of the total data center power consumption level to avoid overloading either of the secondary AC power source and the primary AC power source. The user interface 106 is configured to display system operational parameters to a user and to accept input from a user for configuration and operation of the power management system 100. In at least some embodiments the modules 102, 106 can be implemented as software, running on one or more processors, and implementing one or more of the methods described herein.

In many embodiments, the power system 10 and the power management system 100 provide a variety of benefits relative to existing power supply systems. For example, the power system 10 and the power management system 100 employ reduced layers of redundancy relative to existing power supply systems as a result of each of the power systems 10 including multiple ATSPSUs 20 and one or more battery modules 22. The power system 10 is configured to continue to supply DC power for a period of time in the event of failure of one or both of the first and second AC power sources, thereby providing immunity to many potential failures of the first and second AC power sources. The power system 10 and the power management system 100 can be employed to reduce costs and production capacity constraints that limit growth in a datacenter by using standardized components (e.g., ATSPSUs 20, BMs 22) that can be obtained from multiple sources. In many embodiments, the power system 10 includes multiple ATSPSUs 20 (e.g., 2, 3, 4, 5, 6, or more) and multiple BMs 22 (e.g., 2, 3, or more), the power system 10 can continue to supply DC current even in the event of a failure of one of the ATSPSUs 20 or one of the BMs 22, thereby helping to reduce the number of customers affected when a failure does occur. The power system 10 and/or the power management system 100 can be configured to reflect a desired tradeoff between autonomous operation to avoid failure propagation and networked operation to enable the actions to be based on an overall operational state. In many embodiments, the power system 10 is configured to react to intermittent peaks in power demand via discharging the BMs 22, thereby isolating the primary AC power source from being impacted and allowing corresponding reduction in the size and cost of the primary AC power system relative to existing power supply systems. For example, each of the PSUs 50 can be limited to a maximum power output thereby forcing the BMs 22 to discharge in response to intermittent power demand exceeding the combined maximum output of the PSUs 50. The power system 10 that utilizes the PSA 18 with ATSPSUs 20 and BMs 22 stored on the PSA 18 itself rather than on the server rack 12 provides more physical space on the server rack 12 for other components such as additional hard drives, or cooling systems. Further, the power shelf controller 62, along with the power shelf configuration records, enables the firmware for the ATSPSUs 20 and BMs 22 to be updated without disconnecting the PSA 18 from the server rack 12. Components of the PSA 18 such as individual ATSPSUs 20 or BMs 22 can be swapped out in case of malfunctions or based on other health status information obtained by the power shelf controller 62 and/or ATSPSU controller 52/battery module controller 72. The ATSPSUs 20 and BMs 22 can individually or one at a time update their firmware to avoid shutting down a server rack 12 by utilizing the configuration described herein for PSA 18 and server rack 12.

In many embodiments, the power system 10 and/or the power management system 100 are configured to control operation based on a variety of inputs. The variety of inputs can include any suitable combination of (a) whether the primary AC power source is in an operational state (e.g., providing AC power having a suitable voltage profile) or in a failed state (e.g., failing to provide AC power having a suitable voltage profile), (b) whether the secondary AC power source is in an operational state (e.g., providing AC power having a suitable voltage profile) or in a failed state (e.g., failing to provide AC power having a suitable voltage profile), (c) the voltage between the DC bus bars 14, 16, which can be used to detect failure of a PSU 50 or a BM 22, and can be used to balance the output of the PSUs 50 or the BMs 22 using droop control (e.g., as described herein) (d) amount of DC current supplied to the DC bus bars 14, 16, (e) amount of current being supplied by the DC bus bars 14, 16 to each load, (f) the state of charge of the BMs 22, (g) operational time remaining (e.g., seconds) via power supplied by the BMs 22 or a combination of the BMs 22 and the secondary AC power source, and (h) total amount of load being serviced by the secondary AC power source, which can be used to determine residual capacity available to service additional loads that are candidates for being serviced via the secondary AC power source, for example, as a result of prolonged failure of the primary AC power source.

In many embodiments, the power system 10 and/or the power management system 100 are configured to control operation based on a variety of priorities and constraints. For example, the power system 10 and/or the power management system 100 can be configured to prioritize servicing of a certain load(s) over another load(s) for any suitable reason, such as a customer(s) paying more for better reliability/availability/immunity to outages. For example, the power system 10 and/or the power management system 10 can be configured to decide not to switch over to supplying a load via power received from the secondary AC power source if the load at risk is low priority and the secondary AC power source is already close to being overloaded. The charging of the BMs 22 can be constrained to prevent exceeding the capacity of the primary AC power source in view of the combined power draw of loads being serviced by the primary AC power source. The charging of the BMs 22 can also be constrained to prevent exceeding the capacity of the secondary AC power source in view of the combined power draw of loads being serviced by the secondary AC power source. The number of PSUs 50 supplied power from the secondary AC power source can be constrained to prevent exceeding the capacity of the secondary AC power source in view of the combined power draw of loads being serviced by the secondary AC power source.

In many embodiments, the power system 10 and/or the power management system 100 can be configured to achieve various objectives. For example, the various objectives can include providing power to most (if not all) loads during a utility power outage. The objectives can include keeping the BMs 22 fully charged when possible (e.g., recharging the BMs 22 as fast as possible following discharge of the BMs 22) to be in a state of readiness for a potential failure of the primary AC power source. The objectives can include avoiding supplying power to the loads from the secondary AC power source as much as possible so that the secondary AC power source has residual capacity available to additional load(s). The objectives can include sharing loads by the PSUs 50 of the power system 10 so as to operate the PSUs 50 at an output level for which the PSUs 50 are most efficiently operated. For example, one or more PSUs 50 can be deactivated so as to boost the load handled by the remaining PSUs 50 to an output level in which the remaining PSUs 50 operate more efficiently. In some embodiments, the power system 10 and/or the power management system 100 can be configured to capture and report events regarding the components of the PSA 18 and server rack 12. For example, as described above during the connection by an operator between the PSA 18 and server rack 12 an incorrect configuration may be utilized (e.g., incorrect number of ATSPSUs 20, BMs 22, and connection components based on the parameters included in an associated power shelf configuration record). In such cases, the power shelf controller 62 is configured to prevent powering on the server rack 12 and generate a system event log that can be transmitted to the power management system 100 for correction by an operator. Other events such as individual hardware failures or health information for components (such as relay status or temperature information for components) of the PSA 18 may be captured and reported in system event lots for correction via the power management system 100. In accordance with at least one embodiment, the PSA and/or PSC may include volatile memory for temporarily storing a power shelf configuration record that is communicated by the management module 102, via network 104, to the power system 10 and PSA and/or PSC. During the boot load operation of the corresponding PSA and/or PSC, the power shelf configuration record can be accessed in the volatile memory and configuration checks between an expected number of connections between the PSA and server rack can be compared to the actual number of connections as described herein.

Figure 7:
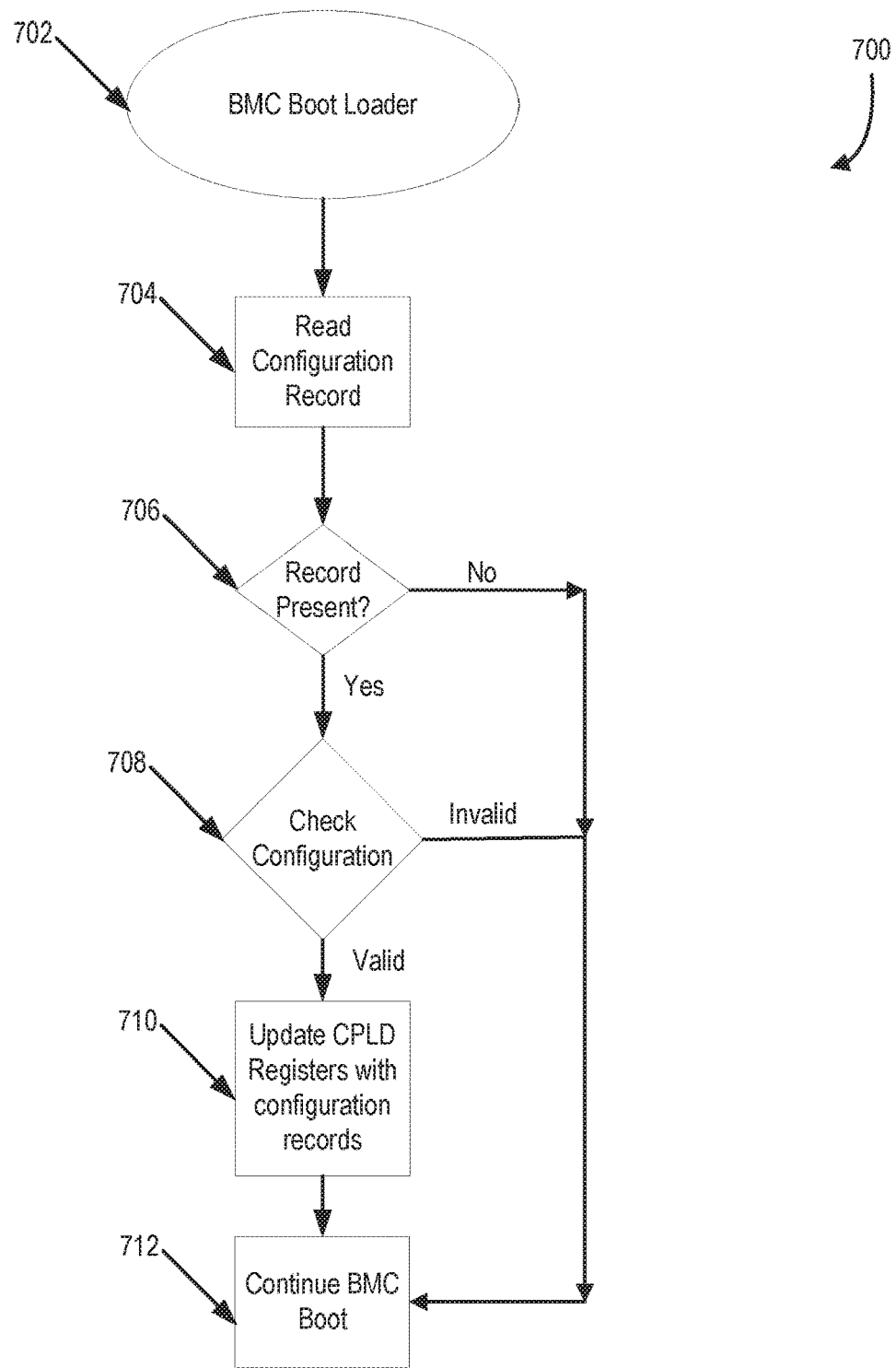
FIG. 7 is a flow chart for a process of identifying whether a power shelf configuration record is present and if so transmitting parameters of the power shelf configuration record to complex programmable logic devices associated with the power shelf assembly during a boot sequence of the power shelf assembly and server rack, in accordance with at least one embodiment.

FIG. 7 is a flow chart for a process of identifying whether a power shelf configuration record is present and if so transmitting parameters of the power shelf configuration record to complex programmable logic devices associated with the power shelf assembly during a boot sequence of the power shelf assembly and server rack, in accordance with at least one embodiment. In various embodiments, the power shelf controller and/or the power shelf assembly may include a baseboard management controller (BMC) or other processor. The power shelf controller and baseboard management controller are configured to prevent energization of the bus bars of the server rack based on an expected power shelf configuration and an actual power shelf configuration. For example, the actual power shelf configuration includes the connection components utilized by an operator attaching the power shelf assembly to the server rack (e.g., number of whips connected between the PSA and server rack that indicates the number of PSUs and BBUs activated as a result of using the connection components between the server rack and the PSA). In the process 700 the baseboard management controller enters a boot loader environment or other startup process at 702. At 704, the power shelf controller attempts to read the power shelf configuration record from an associated storage space such as the non-volatile memory 74 of FIGS. 4 and 5 to identify the parameters that indicate the correct configuration for a given power shelf assembly and server rack. In the process 700, it is determined whether the power shelf configuration record is present at 706 by identifying whether a data object that corresponds to the power shelf configuration record is stored or maintained in the associated storage (e.g., non-volatile memory 74). For example, a read file command may be executed and if the file is found, a found record response may be received, whereas if the record is not present a file not found response may be received. If the power shelf configuration record is present then the process continues at 708 by checking the configuration of ATSPSUs 20, BMs 22, and connection components between the PSA 18 and server rack 12 according to the parameters included in the power shelf configuration record. In some embodiments, checking the configuration between the PSA 18 and the server rack 12 includes identifying a number of connection components actually connected between the server rack 12 and PSA 18 as indicated by whether the connection components are utilized to connect components of the server rack 12 to the PSA 18. The connection components, if connected, will result in a certain number of ATSPSUs 20 and BMs 22 receiving current or power. As described herein, the power shelf configuration record includes information that indicates an expected number of connection components, ATSPSUs 20 and BMs 22 to be connected during a connection process by an operator when the operator is connecting the PSA 18 to the server rack 12. The information about the expected ATSPSUs 20, BMs 22, and connection components is included in the power shelf configuration record and is customized for a particular server rack or server rack type. As such, any unexpected configuration (e.g., incorrect number of connection components utilized resulting in an incorrect amount of ATSPSUs 20 and BMs 22 attempting to be used for the server rack) can result in error flags being set. In accordance with at least one embodiment, at 708, if the actual configuration (e.g., connection components being utilized with ATSPSUs 20 and BMs 22) between the server rack 12 and PSA 18 is different from the expected configuration as indicated by the power shelf configuration record (Invalid), one or more error flags are set and the process continues to the BMC boot 712 where a record of the error flags may be generated and provided to an operator to address the incorrect configuration. In some embodiments, at 708, if the actual configuration between the server rack 12 and PSA 18 is correct as indicated by the associated power shelf configuration record (Valid) the process continues at 710. If the record is not present at 706 or once the configuration has been checked at 708, the power shelf controller is configured to update CPLD registers of the ATSPSUs 20 and BMs 22 with the power shelf configuration record at 710 (e.g., update, transmit, or otherwise communicate the power shelf configuration record from the storage of the PSA 18 to the CPLD registers of the ATSPSUs 20 and BMs 22). Once the configuration has been checked and/or the power shelf configuration record has been transmitted or otherwise communicated to the CPLD registers of the ATSPSUs 20 and BMs 22, the baseboard management controller continues with the booting process for the PSA 18. Although some of the disclosed embodiments describe using CPLD registers to store information from the configuration record, in further embodiments the information can be stored in other forms of memory (e.g., RAM, ROM, Flash RAM, processor registers) in the ATSPSUs, BMs, or other components.

Figure 8:
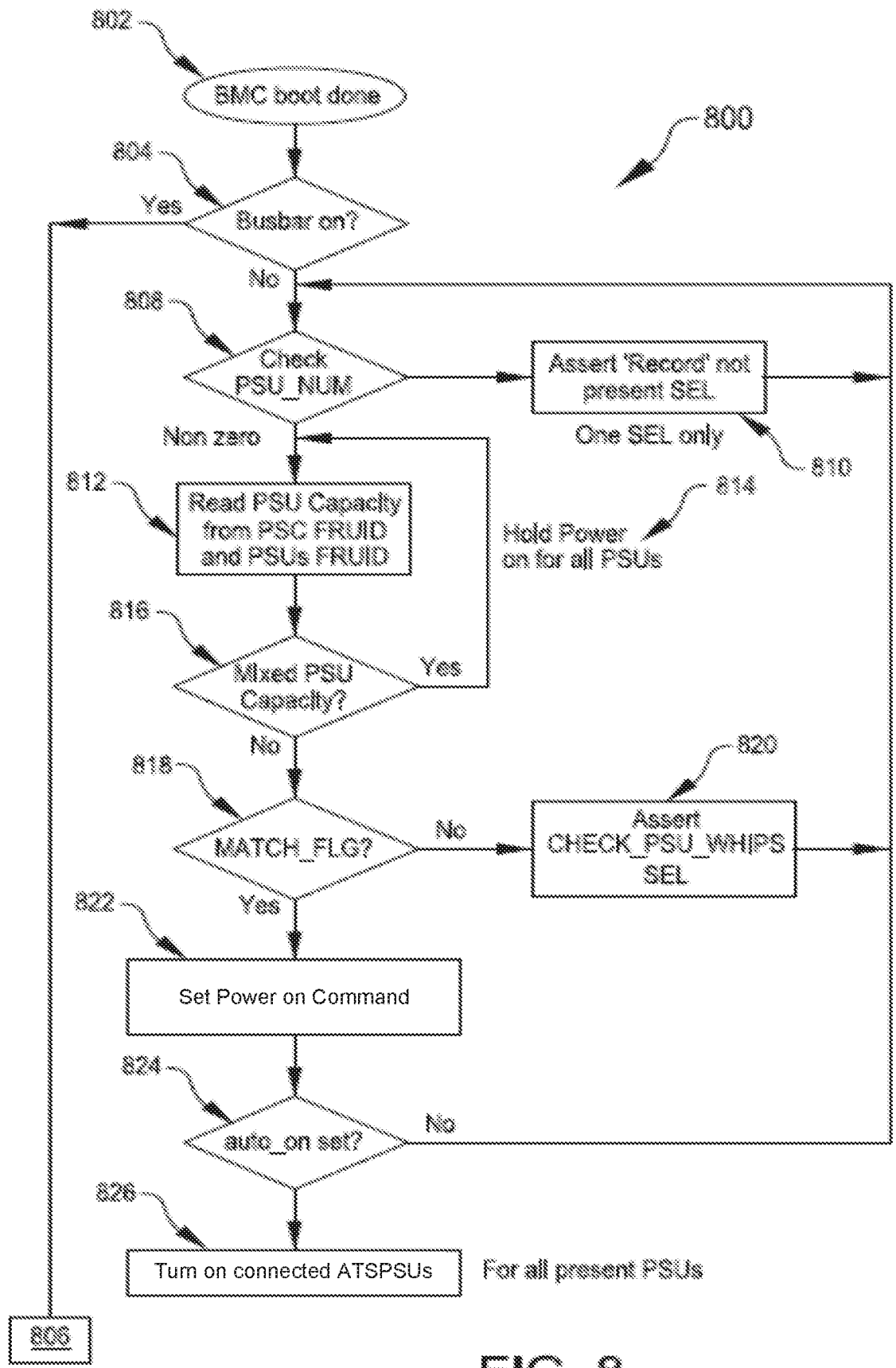
FIG. 8 is a flow chart for a process of identifying that the expected configuration of PSUs and connection components of the power shelf assembly, as identified in the power shelf configuration record, matches the actual configuration of these components, in accordance with at least one embodiment.

FIG. 8 is a flow chart for a process of identifying that the expected configuration of power supply units (PSUs) and connection components of the power shelf assembly and server rack, as identified in the power shelf configuration record, matches the actual configuration of these components, in accordance with at least one embodiment. The process 800 begins at 802 by identifying that the baseboard management controller or other component has completed a boot up operation (e.g., after the process 700 is complete). At 804 of the process 800 it is determined whether the bus bars of server rack 12 are on by receiving an indication of power or current being provided to the bus bars of the server rack 12. If the bus bars of server rack 12 are on, the process 800 concludes at 806 by periodically (e.g., once a day) checking the status/health of components of the PSA 18, as well as periodically identifying whether the correct configuration is being utilized between the PSA 18 and server rack 12 based on input from the components such as the ATSPSUs 20 and BMs 22.

However, if the bus bar is not on at 804, the process continues at 808 by checking whether the correct number of PSUs or ATSPSUs 20 are connected at 808 based on the power shelf configuration record pushed to the ATSPSUs 20 during process 700 described in FIG. 7 (as represented by "Check PSU_NUM", which represents an abbreviation for "check the number of PSUs" in FIG. 8). If the power shelf configuration record is not present and therefor does not indicate the expected number of ATSPSUs 20, then the process 800 includes generating a "record not found" system event log (SEL) at 810 (as represented by "Assert 'Record' not present SEL", which represents an abbreviation for "generate a SEL identifying that the power shelf configuration record is not present"). If the power shelf configuration record is present at 808 then the process includes reading the PSU capacity (e.g., 100 watts, 200 watts, or another capacity) from the PSU FRUIDs (field-replaceable unit identifier) at 812. The process 800 includes deciding or determining 816 whether there is a "mixed" PSU capacity, indicating that not all of the expected PSUs have been connected between PSA 18 and server rack 12. In this case, a "hold power for all PSU" command 814 is executed by the power shelf controller 62 and/or baseboard management controller. This command causes the PSUs to not distribute power. In the process 800, if there is not a mixed capacity at 816, the process continues at 818 by determining whether there is a match or correct number of connection components (whips) being utilized for the expected number of PSUs. As described herein, determining whether there is a match or correct number of connection components (whips) being utilized for the expected number of PSUs includes using indicators or data identifying an actual number of whips connected between the PSA 18 and server rack 12 which is compared to the expected number of whips to be connected between a given PSA 18 and server rack 12 as indicated by the power shelf configuration record. In FIG. 8, at 818, if the there is a match or correct number of connection components (whips), then a flag for a match between the record and components is set as indicated by the "MATCH_FLG" decision at 818 of FIG. 8. If the incorrect number of connection components is identified at 818, then the process includes at 820 generating a "check whips" system event log (SEL) that can be communicated to an operator of power management system 100 (as represented by the "Assert CHECK_PSU_WHIPS SEL 820" of FIG. 8 that represents generating a SEL that identifies an incorrect configuration between the PSU and WHIPS as indicated by the power shelf configuration record). In the process 800, if the number of ATSPSUs 20 and connection components matches the expected number of ATSPSUs 20 and connection components identified in the power shelf configuration record, then the process 800 proceeds at 822. At 822 the process sets the CPLD command, or executes by the CPLD, a "power on" command for all associated ATSPSUs 20 and BMs 22 of a given PSA 18. This causes the ATSPSUs 20 and BMs 22 to provide power to an attached server rack 12. The process 800 continues at 824 by identifying whether an "auto on" flag has been set for the components of PSA 18 and, if not, returning to step 808. The process returns to step 808 to redundantly check the configuration record and process through steps 810-822 to identify a match between expected components as identified in the power shelf configuration record and the actual number of connected components between the server rack 12 and PSA 18. However, if the auto on flag has been set for the components of PSA 18, the process concludes at 826 by executing a command to turn on all connected ATSPSUs 20.

FIG. 9 is an example power shelf configuration record, in accordance with at least one embodiment. The power shelf configuration record 900 includes fields 902, lengths 904, values 906, and remarks 908 for the parameters included in an exemplary power shelf configuration record. It should be noted that although FIG. 9 depicts the remarks 908 as part of the power shelf configuration record 900, in some embodiments the remarks may not be part of the power shelf configuration 900. The first field 902 at 910 identifies a record type which in this case, as indicated by the remark 908 identifies that this record is a power shelf configuration record. In the depicted embodiment, the record type 910 has a length 904 of 0x01 (hexadecimal) byte and a value 906 of 0xC0. In some embodiments, the power shelf configuration record 900 may include a record checksum 912 and a header checksum 914. In accordance with at least one embodiment, the record checksum 912 and header checksum 914 may be utilized to identify that a correct power shelf configuration record is being utilized for a given server rack and/or for security purposes to identify a correct originating author of the power shelf configuration record 900. In various embodiments, the record checksum 912 and header checksum 914 are utilized to determine the integrity of the power shelf configuration record 900. The power shelf configuration record 900 includes a data center type 916 field 902 with bit identifiers 918 that are associated with different data center types. For example, the bit identifiers 918 may be an unsigned 8-bit integer in hexadecimal format that represents a data center type to indicate the type of data center that the associated power shelf assembly is to be connected to in a data center. This may be useful if, for example, a particular model of power shelf is used in data centers that have differing electrical systems or requirements. The power shelf configuration record 900 includes an indication of a number of whips 920 (or connection components) that are to be utilized given the number of PSUs 924. The remarks 908 section for the number of whips 920 includes an unsigned 8-bit integer in hexadecimal format that represents the total number of whips in the power shelf assembly that should be utilized to connect the correct number of PSUs 924 for a given type of data center 918. The remarks 908 for the number of PSUs 924 field 902 includes an unsigned 16-bit integer in hexadecimal format that represents the total number of expected or installed PSUs or ATSPSUs in power shelf assembly for a given data center type 918.

The embodiments that describe the datacenter power management system or other embodiments that describe utilizing a network may utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and AppleTalk. The network can be, for example, a local area network, a wide-area network, a virtual private network, the Internet, an intranet, an extranet, a public switched telephone network, an infrared network, a wireless network, and any combination thereof.

The power shelf assembly and/or power shelf controller can include a variety of data stores and other memory and storage media as discussed above. These can reside in a variety of locations within the power shelf assembly, such as on a storage medium local to (and/or resident in) one or more of the computers of the power shelf assembly or remote from any or all of the computers across the network (e.g., the management module). In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc. The storage media may be non-transitory.

Such devices also can include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A power system for supplying direct current (DC) power to a server rack, the power system comprising:
   a power shelf assembly (PSA) configured to be mounted in the server rack and including:
      a power supply unit (PSU) configured to output DC power to DC bus bars of the server rack;
      a power shelf controller (PSC) configured to:
         store a power shelf configuration record that includes parameters for a particular type of the server rack, the parameters of the power shelf configuration record comprising a number of whips, a number of PSUs, a PSU capacity, or a data center type in which the server rack is installed;
         prevent energization of the DC bus bars of the server rack based on a power shelf configuration associated with the power shelf assembly and a power sequencing of the PSU; and
         transmit the parameters to components of the PSA;
      a processor that is configured to:
         receive the parameters in response to a bootloader execution of the PSC;
         using the parameters, make a comparison of an expected number of connection components between the PSA and the server rack and an actual configuration of the connection components between the PSA and a server of the server rack; and
         prevent the PSU from turning on based on the comparison.

2. The power system of claim 1, wherein the processor or the PSC is further configured to identify an incorrect configuration between the expected number of the connection components and the actual configuration of the connection components between the PSA assembly and the server rack based on the parameters.

3. The power system of claim 2, wherein the PSC is further configured to generate a system event log in response to the identification, by the processor, of the incorrect configuration.

4. The power system of claim 3, wherein the PSC is further configured to periodically transmit the system event log to a management module associated with a data center.

5. An apparatus, comprising:
   a power shelf controller (PSC) configured to:
      store a power shelf configuration record that includes parameters for a particular type of a server rack;
      prevent energization of direct current (DC) bus bars of the server rack based a power shelf configuration associated with a power shelf assembly and a power sequencing of a power supply unit (PSU) of the apparatus; and
      transmit the parameter to a programmable component of the apparatus, the parameters of the power shelf configuration record comprising a number of whips, a number of PSUs, a PSU capacity, or a data center type in which the server rack is installed;

wherein the programmable component is configured to:
receive the parameters in response to a bootloader process of the PSC;
make a comparison, based on the parameters, of an expected number of connection components between the apparatus and the server rack and an actual configuration of the connection components between the apparatus and the server rack; and
set a flag associated with the PSU identifying an automatic power on in response to the comparison.

6. The apparatus of claim 5, wherein the PSC is further configured to execute a command to update a flag indicating that the PSU should be powered on based on the comparison.

7. The apparatus of claim 5, wherein the PSC is further configured to generate a system event log in response to a swap out operation of the PSU for an other PSU in the apparatus.

8. The apparatus of claim 7, wherein the programmable component is further configured to periodically compare the expected number of connection components between the apparatus and the server rack and the actual configuration of the connection components between the apparatus and the server rack to identify the swap out operation of the PSU for the other PSU.

9. The apparatus of claim 5, wherein the PSC is configured to update the power shelf configuration record based on instructions received via a network communication port of the apparatus, the update of the power shelf configuration record including a further update to the parameters.

10. The apparatus of claim 5, wherein the power shelf configuration record is formatted according to a format associated with the PSC.

11. The apparatus of claim 5, wherein the apparatus is further configured to continue to provide DC power to the DC bus bars of the server rack in response to removal of the PSC.

12. The apparatus of claim 5, wherein the power shelf configuration record is stored in non-volatile memory associated with the apparatus.

13. A computer-implemented method, comprising:
maintaining a power shelf configuration record that includes parameters for a particular type of server rack and that identifies an expected configuration of power supply units (PSUs) and connection components to use with the particular type of the server rack;
preventing energization of direct current (DC) bus bars of the server rack based on a power shelf configuration associated with a power shelf assembly (PSA) of the server rack and a power sequencing of the PSUs;
transmitting the parameters to a programmable component the parameters of the power shelf configuration record comprising a number of whips, a number of the PSUs, a PSU capacity, or a data center type in which the server rack is installed; and
enabling, via the programmable component, execution of a power supply on command for the PSUs based on a comparison of the expected configuration and an actual configuration of the power supply units (PSUs) and connection components of a server rack of the particular type.

14. The computer-implemented method of claim 13, wherein the power shelf configuration record includes a record checksum and a header checksum for use in determining integrity of the power shelf configuration record.

15. The computer-implemented method of claim 13, wherein the PSA further includes a backup battery unit (BBU) that is configured to supply DC power to the server rack in response to an indication of loss of power from a first AC power source and during a transition to a second AC power source.

16. The computer-implemented method of claim 13, wherein the parameters of the power shelf configuration record identifies a particular number of backup battery units (BBUs) associated with the PSA.

17. The computer-implemented method of claim 13, wherein a PSU of the PSUs further comprises an automatic transfer switch power supply unit (ATSPSU) having ATSPSU firmware configured to be updated without interrupting DC power to the DC bus bars of the server rack.

18. The computer-implemented method of claim 13, wherein the PSA further comprises a backup battery unit (BBU) having BBU firmware configured to be updated without interrupting DC power to the DC bus bars of the server rack.

19. The computer-implemented method of claim 13, further comprising generating a system event log identifying a health status for the PSUs.

* * * * *

UNITED STATES PATENT AND TRADEMARK OFFICE
CERTIFICATE OF CORRECTION

PATENT NO. : 10,725,519 B1
APPLICATION NO. : 15/905037
DATED : July 28, 2020
INVENTOR(S) : Anand Misra et al.

Page 1 of 1

It is certified that error appears in the above-identified patent and that said Letters Patent is hereby corrected as shown below:

In the Claims

Column 16, Line 62, Claim 5:
Delete: "the server rack based a power shelf configuration"
Insert: -- the server rack based on a power shelf configuration --

Signed and Sealed this
Eighth Day of December, 2020

Andrei Iancu
*Director of the United States Patent and Trademark Office*